United States Patent
Kohnke et al.

(10) Patent No.: US 6,221,566 B1
(45) Date of Patent: Apr. 24, 2001

(54) OPTICAL WAVEGUIDE PHOTOSENSITIZATION

(75) Inventors: Glenn Eric Kohnke, Painted Post; Danny Wayne Nightingale, Beaver Dams; Peter Gerard Wigley, Corning, all of NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 09/252,151

(22) Filed: Feb. 18, 1999

(51) Int. Cl.[7] .................................................. G02B 6/16

(52) U.S. Cl. ...................... 430/321; 430/330; 430/290; 385/123; 385/124; 385/37; 385/141

(58) Field of Search ................................ 430/321, 290, 430/330; 385/124, 123, 141, 37

(56) References Cited

U.S. PATENT DOCUMENTS

| | | | |
|---|---|---|---|
| 5,235,659 | 8/1993 | Atkins et al. | 385/124 |
| 5,287,427 | 2/1994 | Atkins et al. | 385/124 |
| 5,478,371 | * 12/1995 | Lemaire et al. | 65/384 |
| 5,495,548 | 2/1996 | Bilodeau et al. | 385/123 |
| 5,500,031 | 3/1996 | Atkins et al. | 65/386 |
| 5,574,810 | 11/1996 | Byron et al. | 385/37 |
| 5,745,615 | 4/1998 | Atkins et al. | 385/37 |
| 5,745,617 | 4/1998 | Starodubov et al. | 385/37 |
| 5,748,814 | 5/1998 | Painchaud et al. | 385/37 |
| 5,930,420 | * 7/1999 | Atkins et al. | 430/290 |
| 6,018,160 | * 1/2000 | Bennion et al. | 356/32 |

FOREIGN PATENT DOCUMENTS

| | | | |
|---|---|---|---|
| 0805365 | * 11/1997 | (EP) | 430/321 |
| 2 323 441 | 9/1998 | (GB) . | |
| 8-286013 | * 11/1996 | (JP) . | |

OTHER PUBLICATIONS

Atkins et al., Photosensitivity and grating writing in hydrogen loaded germanosilicate core optical fibers at 325 and 351 nm., Appl. Phys. Lett., vol. 70(9) pp. 1068–1069, Mar. 1997.*

Othonos, A., et al., "Fiber Bragg Gratings", Artech House, Boston, pp. 9–10 and 389, 1999.*

Lemaire, P.J. et al., "High Pressure $H_2$ Loading as a Technique for Achieving Ultrahigh UV Photosensitivity and Thermal Sensitivity in $GeO_2$ Doped Optical Fibres", Electronics Letters, vol. 29, No. 13, Jun. 24, 1993, pp. 1191–1193.

Wiesmann, D. et al., "Large UV–induced negative index changes in germanium–free nitrogen–doped planar $SiO_2$ waveguides", Electronics Letters, vol. 34, No. 4, Feb. 19, 1998, pp. 364–366.

(List continued on next page.)

Primary Examiner—Martin Angebranndt
(74) Attorney, Agent, or Firm—David L. Berdan; Timothy R. Krogh

(57) ABSTRACT

The present invention is directed to a method of enhancing the photosensitivity of an optical waveguide and an optical waveguide having persistent UV photosensitivity following out diffusion of a loading gas such as $H_2$ or $D_2$. The optical waveguide is loaded with a gas such as $H_2$ or $D_2$ to form an associated baseline refractive index. At least a portion of the loaded optical waveguide is exposed to UV radiation to induce a change in the baseline refractive index and the waveguide is annealed to diffuse the gas from the loaded optical waveguide and to stabilize the change in refractive index. Following annealing the optical waveguide retains a UV photosensitivity sufficient to produce significant refractive index changes relative to the induced change in baseline refractive index. The method of the present invention is particularly well suited for designing and fabricating grating devices, tuning grating strength and wavelength, and for providing accurate spatial control of waveguide photosensitivity. Waveguides having complex photosensitivity profiles as a function of length are also disclosed.

26 Claims, 5 Drawing Sheets

OTHER PUBLICATIONS

Eggleton, B.J. et al., "Long periodic superstructure Bragg gratings in optical fibres", Electronics Letters, vol. 30, No. 19, Sep. 15, 1994, pp. 1620–1622.

Bilodeau, F. et al., "Photosensitization of optical fiber and silica–on–silicon/silica waveguides", Optics Letters, vol. 18, No. 12, Jun. 15, 1993, pp. 953–955.

Fertein, E. et al., "Shifts in Resonance Wavelengths of Bragg Gratings During Writing or Bleaching Experiments by UV Illumination within Germanosilicate Optical Fibre", Electronics Letters, vol. 27, No. 20, Sep. 26, 1991, pp. 1838–1839.

Ibsen, M. et al., "30dB sampled gratings in germanosilicate planar waveguides", Electronics Letters, vol. 32, No. 24, Nov. 21, 1996, pp. 2233–2235.

* cited by examiner

OPTICAL WAVEGUIDE PHOTOSENSITIZATION

BACKGROUND OF THE INVENTION

1. Field of the Invention

The present invention relates generally to enhancing the photosensitivity of optical waveguides, and more particularly to a method for increasing optical waveguide photosensitivity to radiation, such as, ultra-violet radiation.

While the present invention is subject to a wide range of applications, it is particularly well suited for providing persistent ultra-violet photosensitivity to optical waveguides and tailoring the refractive index profiles of such waveguides.

2. Technical Background

Gratings produced by ultra-violet (UV) induced refractive index changes in optical waveguides are well known in the art. Broadly speaking, such gratings generally fall into one of two categories. The first category of gratings known as a long period grating (LPG) is commonly formed by UV exposure through an amplitude mask. The second category known as a short period grating or fiber Bragg grating (FBG) is typically formed using two—beam interference. Generally speaking, the use of a phase mask to create the two—beam interference is currently recognized as a preferred method of "writing" an FBG into an optical waveguide. With respect to both of these categories of gratings, it has been found that the strength of the grating (i.e., the change in refractive index resulting from UV exposure relative to the optical waveguide refractive index prior to UV exposure) is dependent upon, inter alia, the photosensitivity of the optical waveguide.

Gratings are typically formed in doped silica glasses commonly used in both planar waveguides and optical waveguide fibers which in turn are commonly used in opto-electronic components and other devices of telecommunication systems. It has been found that the sensitivity of optical waveguides containing these doped silica glasses to UV radiation can be enhanced by a hydrogen treatment. Early proposed $H_2$ sensitization treatments involved exposing a germania doped silica glass to $H_2$ at a relatively high temperature, typically at least 400° C. Such high temperatures proved detrimental to germania doped optical waveguide fibers, as well as to other optical waveguide fibers containing other dopants. In view of the fact that optical waveguide fibers are typically coated with a polymeric coating material as part of the draw process, such extreme temperatures were found to destroy or at least severely damage the fiber coatings. Moreover, such high temperature sensitization treatments typically increased the attenuation associated with the fiber and/or weakened the fiber itself. In view of these shortcomings, improved $H_2$ loading techniques have been developed. As a result, the photosensitive response of standard optical waveguide materials has been dramatically enhanced.

In one such technique, an $SiO_2$—based optical waveguide is exposed to an $H_2$ atmosphere (partial pressure greater than one atmosphere) at low temperature (at most 250° C.) for a period of days or weeks, such that the $H_2$ diffuses into the optical waveguide. Such $H_2$ loaded optical waveguides are then exposed to UV radiation to increase the refractive index of the irradiated portion of the optical waveguide, thus forming a grating. Normalized index changes on the magnitude of $5\times10^{-5}$ or $10^{-4}$ have been achieved for practical devices using this technique while index changes as high as $10^{-2}$ have been reported for certain specialty fibers having less practical application. It was found that the index changes could persist substantially indefinitely provided the waveguide was not heated, and that at least a significant fraction of the change could survive moderate heating (e.g., less than or equal to 400° C.).

In a more recent development, it has been found that the index of refraction of a germania doped optical waveguide fiber can be increased by treating the fiber with hydrogen and applying heat. The glass is exposed to hydrogen at a pressure in the range 14–11,000 p.s.i. and a temperature in the range 21° to 150° C. until sufficient hydrogen is diffused into the fiber. The fiber is then subjected to heat in excess of about 500° C. using a flame or infrared radiation for a period of a second or less. This technique results in a substantial and long-lived increase in the normalized refractive index. Flame heating of a single mode germania doped optical waveguide fiber has produced normalized index changes ($\Delta n/n$) of $4\times10^{-3}$.

Both of the above-described techniques rely on hydrogen loading to provide the required optical waveguide photosensitivity. Once loaded, the waveguide is then exposed to either UV radiation or heat to change the refractive index of the waveguide. With the exception of annealing to stabilize the index change, no further processing steps are contemplated by the above-described techniques. Accordingly, devices produced by these techniques have refractive index characteristics which can vary substantially due to, among other things, variations in fiber geometry, and/or the intrinsic photosensitivity of the fiber. Thus, although the above-described techniques can produce significant refractive index changes, there is little control over the accuracy of those changes. As a result, only a small percentage of the devices produced by the above-described techniques are capable of adequately meeting the needs and requirements of the systems in which they will be used absent some additional processing.

This is especially true of grating devices. With respect to FBG devices, for instance, the above-described $H_2$ loading techniques lack sufficient accuracy with reasonable yield to selectively remove only the desired wavelength or wavelengths. For LPG devices, variation in center wavelength results in a low yield of acceptable devices.

In view of the foregoing, there is a need for a method of enhancing the UV photosensitivity of an optical waveguide, which simplifies the grating manufacture process while increasing the yield of acceptable gratings. In addition, there is a need for an optical waveguide which retains significant photosensitivity following out diffusion of the loading gas such that significant changes in refractive index can be achieved by exposing the waveguide to additional radiation treatments. Moreover, there is a need for a method of controlling the photosensitivity of an optical waveguide on a spatial scale on the order of microns.

SUMMARY OF THE INVENTION

One aspect of the present invention relates to a method of enhancing the photosensitivity of an optical waveguide which includes the steps of loading an optical waveguide with $H_2$ or $D_2$ to form a base line refractive index, treating at least a portion of the loaded optical waveguide with radiation to induce a change in the baseline refractive index, and diffusing the gas from the loaded optical waveguide so that the optical waveguide retains a UV photosensitivity sufficient to produce refractive index changes greater than $10^{-5}$ relative to the induced change in base line refractive index with subsequent treatments.

Another aspect of the present invention relates to writing a grating in the optical waveguide after the diffusing step. Gratings such as LPG devices and FBG devices can be written in the optical waveguide using techniques commonly applied in the art.

Yet another aspect of the present invention relates to a method of tuning gratings which includes the steps of loading an optical waveguide with an $H_2$ or $D_2$ gas, irradiating at least a portion of the loaded optical waveguide with radiation to write a grating in the loaded optical waveguide, diffusing the gas from the loaded optical waveguide, and exposing at least a portion of the loaded optical waveguide to UV radiation to induce a change in the refractive index of the grating.

A still further aspect of the present invention relates to a method in which the irradiating step includes passing UV radiation through an amplitude mask to form a LPG device within the optical waveguide.

An additional aspect of the present invention relates to a method in which the irradiating step includes passing UV radiation through a phase mask to form an FBG device in the optical waveguide.

The method of the present invention results in a number of advantages over other methods known in the art. For example, the method of the present invention produces an optical waveguide having persistent UV photosensitivity after the loading gas has diffused from the optical waveguide. Accordingly, it is possible to write a grating device, which is sufficiently strong and has the desired characteristics in an optical waveguide, which no longer contains the loading gas. As a result, the grating writing process is streamlined in that premature out diffusion of the loading gas is less problematic. The novel combination of $H_2$ or $D_2$ loading of optical waveguides followed by UV flood exposure has resulted in waveguides which retain a UV photosensitivity sufficient to produce refractive index changes greater than $10^{-4}$. Moreover, in certain applications of the present invention, retained UV photosensitivity sufficient to produce refractive index changes of less than $10^{-4}$ is considered novel and significant.

In addition, the method of the present invention provides a number of advantages not otherwise provided by other methods known in the art. Once a grating is written, UV flood exposure can be used to tune the grating wavelengths. In gain flattening applications, wavelength error of a gain flattening filter results in amplifier power variation as a function of wavelength, thus the tuning application of the present invention provides for a more consistent power level in the output of the amplifier. These capabilities make this aspect of the method of the present invention particularly well suited for such applications as gain flattening filters for use in amplifiers. In addition, the tuning aspects of the present invention provide a greater yield of gratings having the desired characteristics and capabilities prior to packaging. Heretofore, mechanical tuning techniques, such as tension tuning following packaging, among others, have been relied upon to tune grating strength and wavelength. Moreover, as grating device technologies mature, there is an increasing interest in chirped gratings and gratings with unusual apodization profiles. Generally, such gratings are fabricated by spatial control of the exposing beam and/or specialty phase masks. Until now, the spatial photosensitivity of the fiber has remained constant. The photosensitivity of an optical fiber can now be controlled on a spatial scale on the order of microns.

Additional features and advantages of the invention will be set forth in the detailed description which follows, and in part will be readily apparent to those skilled in the art from the description, or recognized by practicing the invention described in the written description and claims hereof, as well as the appended drawings. It is to be understood that both the foregoing general description and the following detailed description are merely exemplary of the invention, and are intended to provide an overview or framework to understanding the nature and character of the invention as it is claimed:

The accompanying drawings are included to provide a further understanding of the invention and are incorporated in and constitute a part of this specification. The drawings illustrate one or more embodiments of the invention, and together with the description serve to explain the principles and operation of the invention.

DETAILED DESCRIPTION OF THE PREFERRED EMBODIMENTS

Reference will now be made in detail to the present preferred embodiments of the present invention, examples of which are illustrated in the accompanying drawings. Wherever possible, the same reference numbers will be used throughout the drawings to refer to the same or like parts. Generally speaking, the method of the present invention is directed to enhancing the photosensitivity of an optical waveguide by irradiating at least a portion of the optical waveguide with radiation. In an exemplary embodiment, the optical waveguide is hydrogen loaded prior to UV exposure. By "hydrogen" or "$H_2$", we mean herein, hydrogen and/or its isotope deuterium ($D_2$).

The present invention expressly contemplates the manufacture of optical waveguide fibers, both single-mode and multi-mode, as well as planar waveguides, regardless of any specific description, drawings, or examples set out herein. In addition, it is anticipated that the present invention can be practiced in conjunction with any of the known optical waveguide processing techniques, including, but not limited to, the outside vapor deposition (OVD) technique, the modified chemical vapor deposition (MCVD) technique, the vertical axial deposition (VAD) technique, the plasma chemical vapor deposition (PCVD) technique, and sol-gel techniques. For the purposes of this specification, and to more clearly describe the various embodiments of the present invention, preferred embodiments of the method of enhancing the photosensitivity in optical waveguides, and optical waveguides made by the method, will be described herein and shown in the accompanying drawing figures as being optical waveguide fiber, and specifically optical waveguide fiber manufactured using the OVD technique.

Figure 1:
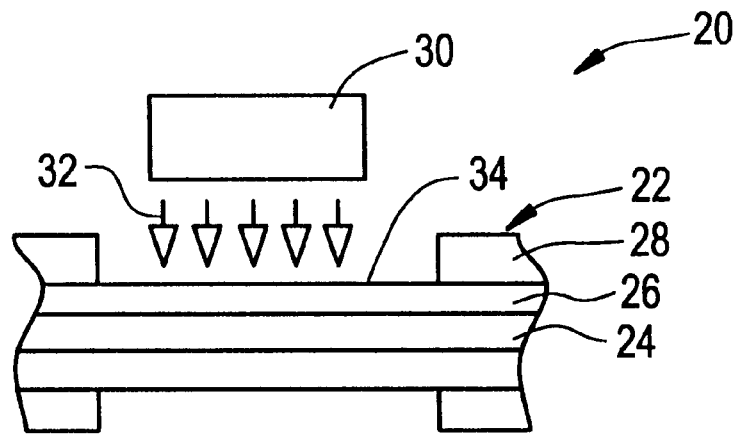
FIG. 1 is a schematic view of the flood exposure step of an exemplary embodiment of the present invention.

An exemplary embodiment of the method of enhancing the photosensitivity of an optical waveguide fiber is shown, in part, in FIG. 1. Prior to UV flood exposure 20, optical waveguide fiber 22 is hydrogen loaded (100 atm at 25° C. for 2 weeks). To inhibit out diffusion of the $H_2$, hydrogen loaded optical waveguide fiber 22 may be stored in a freezer until such time as UV exposure is desired. Hydrogen loaded optical waveguide fiber 22 includes an elongate core 24 having a relatively high refractive index, surrounded by a relatively low refractive index cladding 26. Cladding 26 is preferably bound by a polymeric coating 28. Preferably, the predominantly $SiO_2$ containing hydrogen loaded optical waveguide fiber 22 is doped with a dopant such as, but not limited to, germania ($GeO_2$). A portion of coating material 28 is removed from the hydrogen loaded optical waveguide fiber 22 and the fiber 22 is positioned adjacent a source of UV radiation, preferably an excimer laser 30. Laser 30 delivers uniform UV light 32 over the exposed waveguide section 34 of hydrogen loaded optical waveguide fiber 22 for a period of time sufficient to increase the refractive index of the optical fiber 22. Typical exposure times range from minutes to several hours, depending upon the magnitude of the Δn desired. Generally speaking, the greater the flood exposure time, the greater the change in refractive index. Once the desired change in refractive index has been attained, optical waveguide fiber 22 is annealed at approximately 125° C. for a period of about 24 hours. The annealing step (not shown) diffuses the hydrogen from the loaded optical waveguide fiber 22. It will be understood by those skilled in the art, however, that hydrogen will diffuse from fiber 22 without the application of heat over a longer time period. The exposed waveguide section 34 retains a UV photosensitivity sufficient to produce refractive index changes greater than $10^{-4}$.

Figure 2:
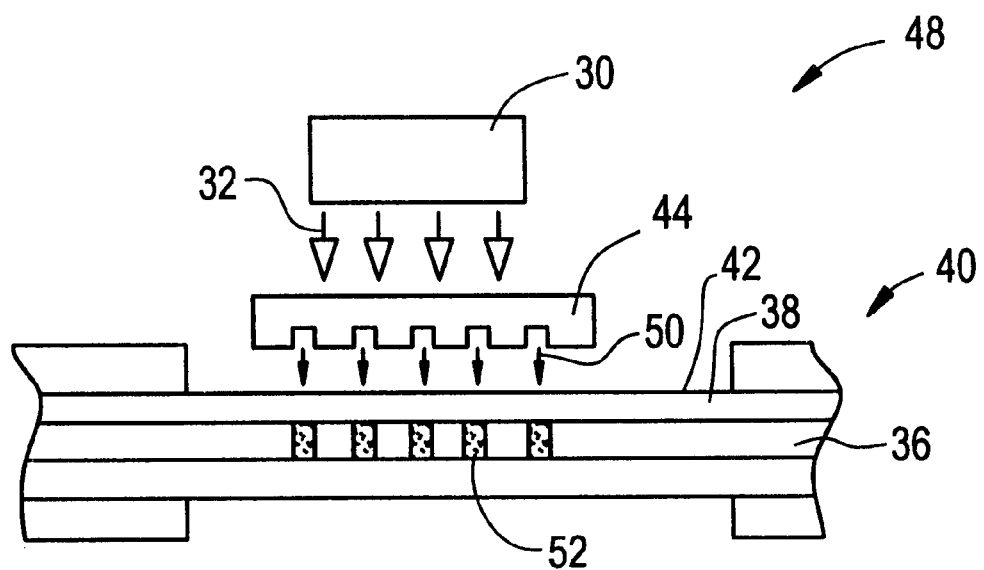
FIG. 2 is a schematic view of an FBG writing step of an exemplary embodiment of the present invention.

The inventive method of the present invention has a variety of uses. In one exemplary embodiment, it can be used to create refractive index gratings within the core 36 of a photosensitive optical waveguide fiber 40 as shown in FIG. 2. In standard $H_2$ loaded optical waveguide fiber, once the hydrogen has been removed from a hydrogen loaded optical waveguide fiber by annealing or otherwise, exposure to UV radiation has very little effect on the refractive index of the fiber. However, as a result of the UV flood exposure step shown in FIG. 1, the previously exposed section 42 of optical waveguide fiber 40 remains photosensitive following out diffusion of the hydrogen.

As shown in FIG. 2, a phase mask 44 is positioned between the laser 30 and the previously exposed section 42 of optical waveguide fiber 40. UV radiation 32 is then delivered from the laser 30 through the phase mask 44. UV radiation 50 is passed through the phase mask 44 to produce two-beam interference, through the cladding 38, and into the core 36 which induces a change in refractive index within the core 36 of that area of the core 36 exposed to UV radiation 50. The UV exposed portions of the core 36 form the fiber Bragg grating 52.

The strength of the index change is a function of the initial flood exposure time. In addition, it has been found that the UV photosensitivity effects scale with dopant concentration. Thus, the longer the exposure to UV radiation during flood exposure, and the greater the dopant concentration, the larger the induced change in refractive index within the core 36, and thus, the stronger the grating. Although the grating writing step shown in FIG. 2 incorporates a phase mask 44, it will be understood by those skilled in the art that other methods and devices used to create two-beam interference can be substituted for the phase mask 44 used in this embodiment of the present invention. Moreover, the present invention is not limited to UV exposure. Infra-red radiation, such as that delivered by a $CO_2$ laser, or some other narrowly directed heat source can be used to flood expose the fiber or write the grating device in accordance with this embodiment of the present invention, and further can be used for tuning applications as will be described below. In addition, other gratings in addition to FBG devices can be written into the core of the optical waveguide fiber 20 of the present invention as will be more clearly described in the examples which follow below.

Another exemplary use of the method of the present invention is the fine-tuning of grating wavelengths following the grating writing process. This embodiment of the present invention is described below with respect to an LPG device; however, it is to be understood that the use is equally applicable to FBG devices and other grating devices known in the art.

Figure 3:
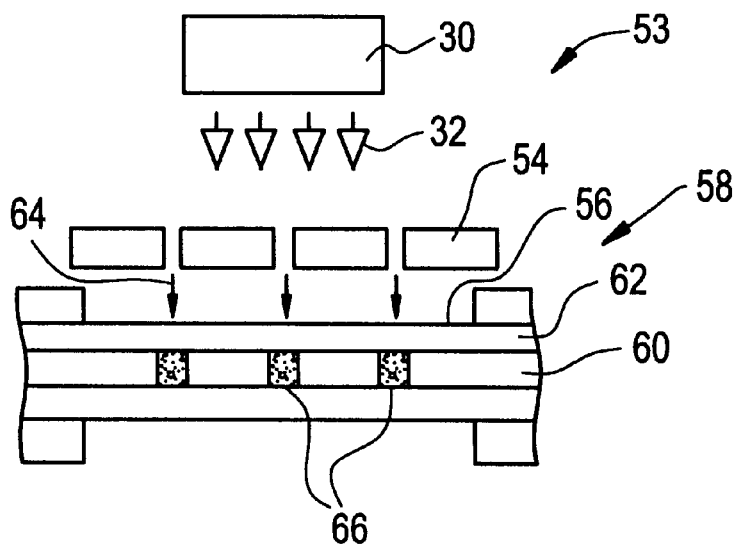
FIG. 3 is a schematic view of an LPG writing step of an exemplary embodiment of the present invention.

A standard LPG exposure process 53 is first carried out with a hydrogen loaded optical waveguide fiber. Accordingly, no UV flood exposure step is required prior to writing the grating. Thus, as shown in FIG. 3, an amplitude mask 54 is positioned between the excimer laser 30 and the uncoated section 56 of the hydrogen loaded optical waveguide fiber 58. UV radiation 32 is then delivered from the laser 30 through the amplitude mask 54, the cladding 62, and into the core 60 of the optical waveguide fiber 58. The UV radiation 64 passing through the amplitude mask 54 exposes the desired LPG device 66 within the core 60, thus changing the refractive index of the exposed portions of the core.

Figure 4:
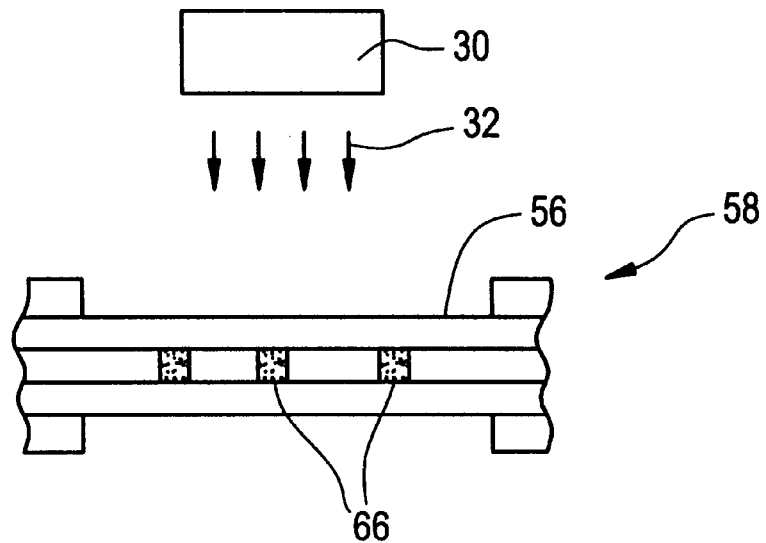
FIG. 4 is a schematic view of a flood exposure step of the exemplary embodiment depicted in FIG. 3.

Following annealing at approximately 125° C. for about 24 hours, an LPG device 66 is placed within an excimer laser exposure system such that the uncoated section 56 of optical waveguide fiber 58 is adjacent the excimer laser 30 as shown in FIG. 4. The uncoated portion 56 of optical waveguide fiber 58 is then exposed to uniform UV light 32 delivered from the laser 30 without the amplitude mask. As a result, the modulation of the grating 66 increases with exposure time. Because the unloaded fiber 58 is not significantly photosensitive, the change in modulation is due to a further increase in the refractive index of the previously exposed portions of the grating. Because wavelength shifts on the order of nanometers are required in tuning applications, this embodiment of the present invention is well suited for such applications.

Following a final annealing step for about 24 hours at approximately 125° C., the induced index change resulting from flood exposure following the grating writing step is stabilized with only about a 40% reduction in the induced index change. Although not shown in the drawing figures, the above-described embodiment is equally applicable to FBG and other grating devices. However, it will be appreciated that the sinusoidal initial grating exposure creates a more complex initial sensitization. Since only the troughs of an FBG device are initially lightly exposed, a flood exposure will effect most of the FBG device and wash out the grating strength as the wavelength shifts. Accordingly, to tune center wavelength, a significantly strong grating must initially be written such that some reduction in strength may be tolerated.

The invention will be further clarified by the following examples, which are intended to be exemplary of the invention.

EXAMPLE 1

Figure 5:
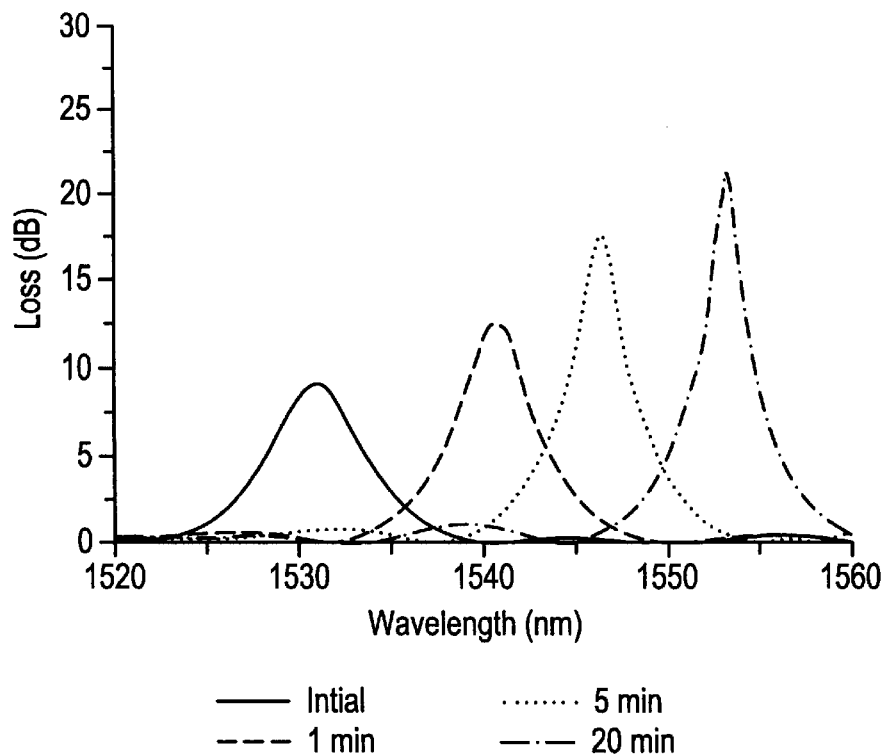
FIG. 5 shows the spectral shift in wavelength with flood exposure time for an LPG written in dispersion shifted fiber in accordance with Example 1 of the present invention.

Following a standard LPG exposure process with hydrogen loaded Corning dispersion-shifted fiber and annealing at approximately 125° C. for 24 hours, the long period grating was placed in an excimer laser exposure system without the usual amplitude mask and flood exposed to a uniform UV beam (approximately 85 mJ/cm$^2$/pulse, 15 Hz, 248 nm). The spectrum of the loss peak corresponding to coupling from the core mode to the lowest order cladding mode is shown at various flood exposure times in FIG. 5. As expected, the peak wavelength of the grating shifts to longer wavelength with exposure time. In addition, the peak loss of the grating also increases with exposure time. This suggests the modulation of the grating is increasing with the additional exposure. Since the unloaded fiber is not significantly photosensitive, the change in modulation is due to a further increase in refractive index of the previously exposed portion of the grating.

Figure 6:
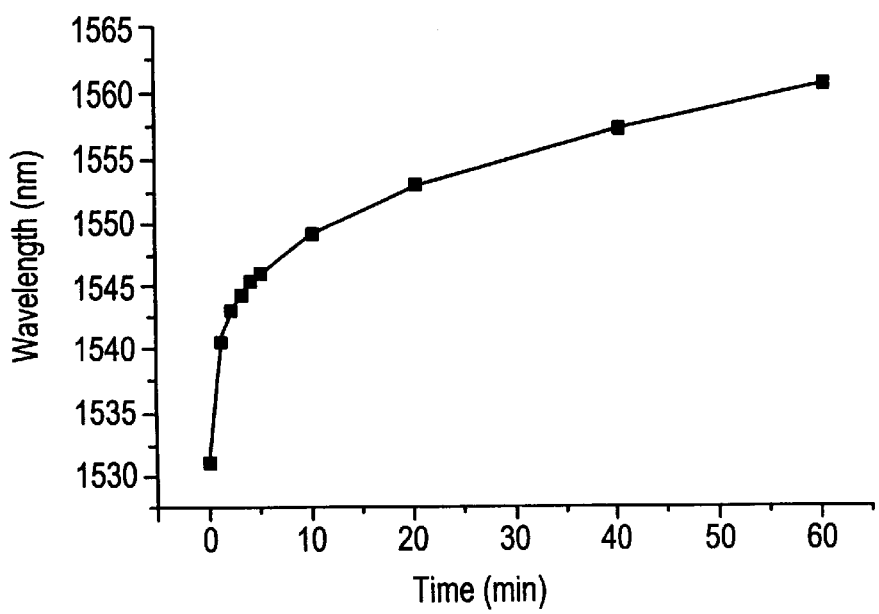
FIG. 6 shows the wavelength shift with flood exposure time for an LPG written in dispersion shifted fiber in accordance with Example 1 of the present invention.

For the tuning application, wavelength shifts on the order of nanometers are required. This technique is clearly suitable for this application. FIG. 6 shows the wavelength shift as a function of the exposure time. For the above-described LPG device, the wavelength shift is approximately linearly related to the induced index change. Following a second annealing step at approximately 125° C. for an additional 24 hours, the induced index change stabilized such that the final peak wavelength of 1551.2 nm was achieved. Accordingly, only about 40% of the induced index change was removed following the second anneal.

EXAMPLE 2

Figure 7:
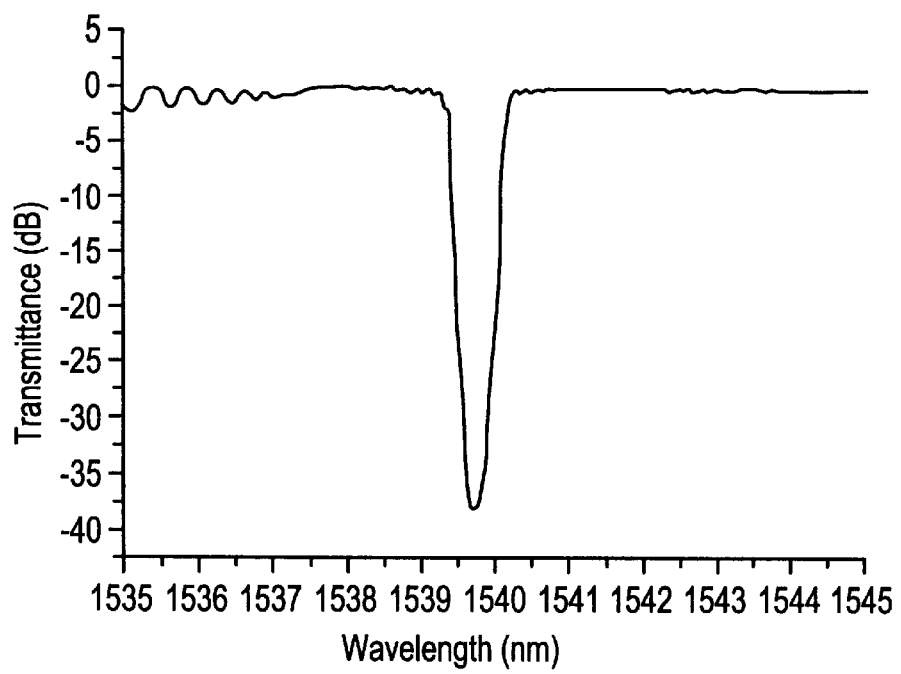
FIG. 7 shows the transmission spectrum of an FBG written in UV flood exposed CS-980 fiber in accordance with Example 2 of the present invention.

A portion of a hydrogen loaded Corning CS-980 fiber (refractive index Δ=1.0%) was exposed to a uniform UV beam (approximately 60 mJ/cm$^2$/pulse, 15 Hz, 32 mm) and was subsequently annealed at approximately 125° C. for about 24 hours. An FBG device was then written using a frequency double dye laser operating at 240 nm, 10 Hz, with an intensity of approximately 50 mJ/cm$^2$/pulse. The grating was approximately uniform along its length of approximately 3.9 mm. The transmission spectrum is shown in FIG. 7 for an exposure time of approximately 20 minutes. The grating has an average UV induced change in refractive index of 7.0×10$^{-4}$ and a modulated change in refractive index of 6.5×10$^{-4}$. The average UV induced index change does not include the increase from the baseline index due to the flood exposure process. Following annealing for approximately 24 hours at 125° C., the grating maintained a modulated Δn of 6.4×10$^{-4}$.

Figure 8:
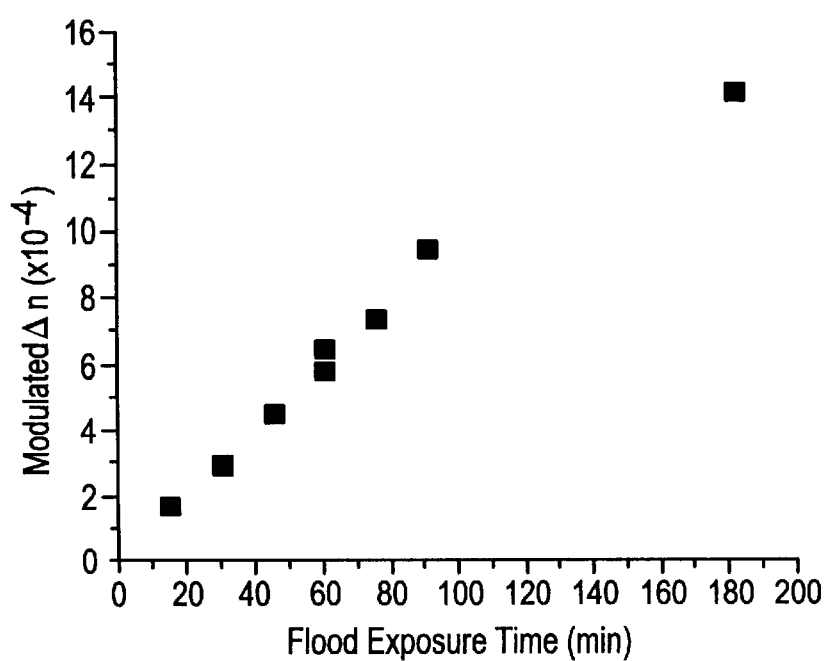
FIG. 8 shows the UV induced refractive index as a function of flood exposure time for an FBG written in CS-980 fiber in accordance with Example 2 of the present invention.

To show that the strength of the index change is a function of the initial flood exposure time, a series of Corning CS-980 fibers were flood exposed for times varying between 15 and 180 minutes with the following exposure conditions: 240 nm, 60 mJ/cm$^2$/pulse, 15 Hz, 32 mm length. Following annealing for about 24 hours at approximately 125° C., a FBG device was subsequently written into each of these fibers. The modulated Δn plotted in FIG. 8 is a function of the flood exposure time. The data is scaled to take into account changes in writing fluence.

Figure 9:
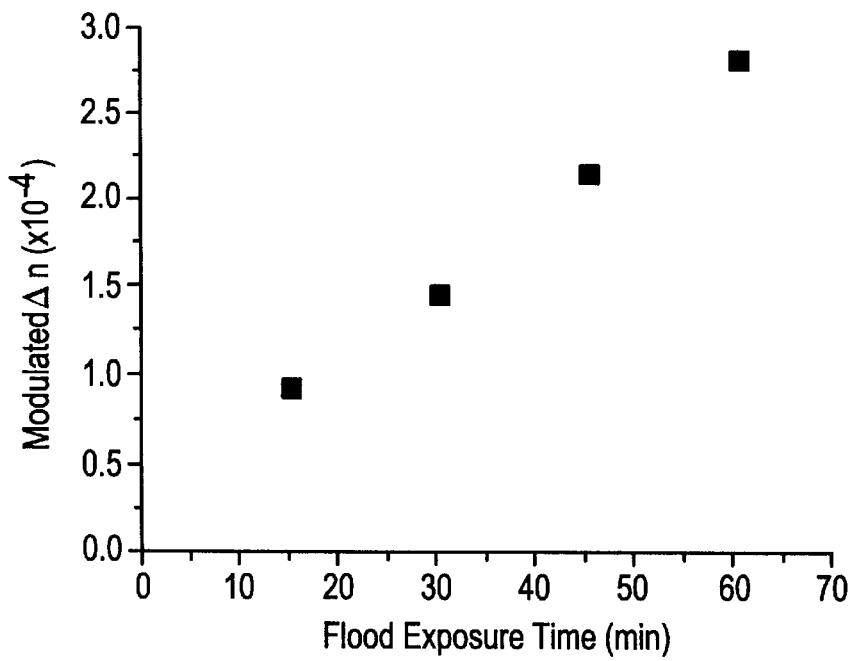
FIG. 9 shows the UV induced refractive index as a function of flood exposure time for an FBG written in SMF-28 fiber in accordance with Example 2 of the present invention.

To demonstrate that the above described effects scale with dopant concentration, data similar to that shown in FIG. 8 was collected for gratings written into Corning SMF-28 fiber (refractive index Δ=0.36%) with flood exposure times between 15 and 60 minutes. The modulated Δn is shown in FIG. 9. The difference between the SMF-28 and CS-980 results correlate roughly with the relative amounts of germanium in the two fibers.

EXAMPLE 3

Figure 10:
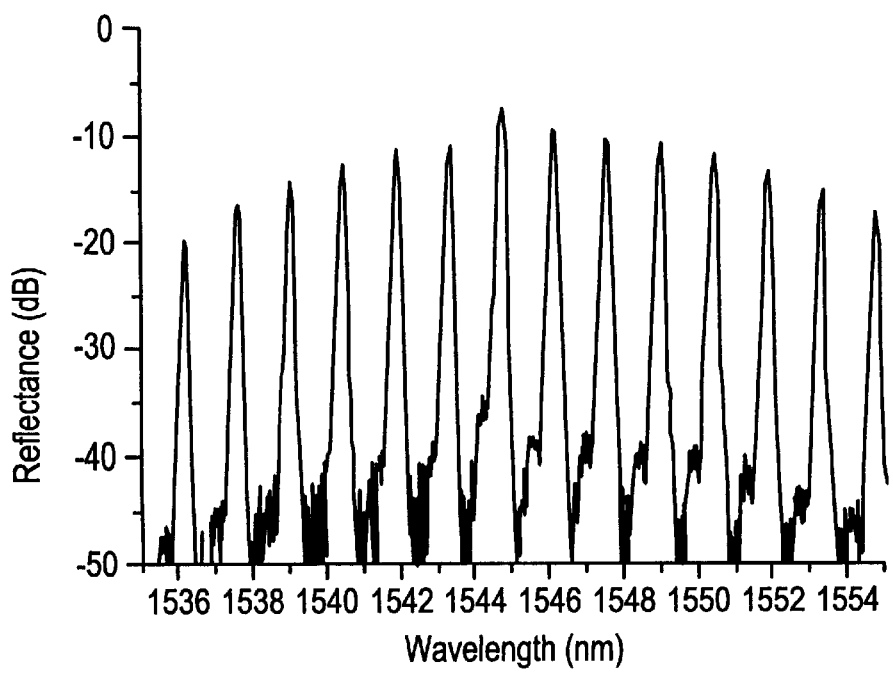
FIG. 10 shows the reflectance spectra of a sampled FBG grating device in accordance with Example 3 of the present invention.

A patterned photosensitivity was also written into the core of an optical waveguide fiber using a non-uniform exposure during the flood exposure step. This was demonstrated using a sampled grating. A sampled grating is an FBG device with a comb filter amplitude along its length. This type of grating has been made previously using a phase mask with an amplitude mask placed immediately before the phase mask. Only those areas through which the amplitude mask permits transmission of UV light are exposed to the sinusoidal intensity pattern to form the grating. Accordingly, this technique allows for the simplification of the FBG writing step. Following hydrogen loading, the fiber was exposed to UV light through an amplitude mask having 64 $\mu$m windows on 564.7 $\mu$m centers. This fiber was then annealed prior to FBG writing. The result was an LPG device which, depending on the strength and location of the peaks, may or may not introduce losses of significant magnitude. An approximately 3.5 mm long FBG device was then written into the fiber using the standard phase mask process and an excimer laser pumped dye laser which was frequency doubled to operate at 248 nm. The exposure intensity was approximately 50 mJ/cm$^2$/pulse. A strong grating was written where the fiber had been previously exposed and a relatively weak grating appears elsewhere due to the low intrinsic fiber photosensitivity. The resulting reflectance spectra shown in FIG. 10 depicts the expected comb-like response. The central grating peak is stronger due to the weak grating written in the previously exposed region consisting of approximately 89% of the grating length.

The concept exemplified in example 3 above can similarly be extended to include various apodization profiles and may be extended to include phase-shifted gratings. Gratings having complex reflectivity and/or dispersion properties will result from this type of photosensitization process. Chirped gratings can be fabricated by tailoring the strength of the photosensitivity or the background refractive index. The flood exposure process produces an increasing refractive index change with increasing exposure time. This may be used to manufacture gratings having non-uniform peak wavelength but using a uniform period exposure process. For example, a linear chirped grating can be fabricated by a linear change in exposure dose along the grating. Such a dose can be fabricated either by scanning a small beam along the fiber length with variable speed, exposing the fiber through a mask with variable transmission, or some combination of the two. Subsequent exposure with a sinusoidal intensity pattern with uniform period results in an effectively chirped grating due to the linear change in resonant wavelength as a function of length. Since the grating strength also depends upon the flood exposure dose, it is preferable to change exposure dose beyond a minimum level that creates a grating of sufficient strength.

It will be apparent to those skilled in the art that various modifications and variations can be made to the present invention without departing from the spirit or scope of the invention. Thus, it is intended that the present invention cover the modifications and variations of this invention provided they come within the scope of the appended claims and their equivalents.

We claim:

1. A method of enhancing the photosensitivity of an optical waveguide, said method comprising the steps of:

loading an optical waveguide with a gas selected from the group consisting of $H_2$ or $D_2$ to form an associated baseline refractive index;

treating at least a portion of said loaded optical waveguide to induce a change in the baseline refractive index in the treated portion; completely diffusing said gas from said loaded optical waveguide to stabilize the induced change in the baseline refractive index, wherein after the step of diffusing, said optical waveguide retains a UV photosensitivity sufficient to produce refractive index changes greater than $10^{-5}$ relative to the stabilized induced change in baseline refractive index; and treating at least the treated portion to induce a change in the stabilized induced change in baseline refractive index.

2. The method as claimed in claim 1 wherein said optical waveguide includes a protective polymeric coating, and wherein the method further comprises the step of removing the coating prior to said first treating step.

3. The method as claimed in claim 1 wherein said first treating step comprises the step of irradiating with a uniform beam of UV radiation.

4. The method as claimed in claim 3 further comprising the step of writing a grating in said optical waveguide after the step of diffusing.

5. The method as claimed in claim 4 wherein the step of writing a grating comprises the step of writing a fiber Bragg grating device.

6. The method as claimed in claim 5 further comprising the step of annealing said optical waveguide after the fiber Bragg grating device is written.

7. The method as claimed in claim 4 wherein the step of writing a grating comprises the step of writing a long period grating device.

8. The method as claimed in claim 1 wherein said first treating step comprises the step of irradiating with a non-uniform beam of UV radiation.

9. The method as claimed in claim 8 further comprising the step of writing a sampled grating into said optical waveguide after the step of diffusing.

10. The method as claimed in claim 8 wherein said step of irradiating comprises the step selected from the group consisting of non-linear exposure over length, linear exposure over length, or periodic exposure over length.

11. The method as claimed in claim 1 wherein said optical waveguide comprises an optical fiber.

12. The method as claimed in claim 1 wherein said optical waveguide comprises a planar optical waveguide.

13. The method as claimed in claim 1 wherein associated with said optical waveguide is a maximum operating temperature, and wherein the step of diffusing comprises the step of heating said optical waveguide to a temperature greater than the maximum operating temperature.

14. The method as claimed in claim 1 wherein said treating steps comprise the steps of irradiating with infra-red radiation.

15. A method of tuning gratings said method comprising the steps of:

loading an optical waveguide with a gas selected from the group consisting of $H_2$ or $D_2$;

irradiating at least a portion of said loaded optical waveguide with radiation to write a grating in said at least a portion of said loaded optical waveguide;

completely diffusing said gas from said loaded optical waveguide wherein said step of diffusing comprises the step of heating said optical waveguide to a temperature greater than about 100° C., and exposing at least a portion of said irradiated portion to radiation to induce a change in the refractive index of said grating.

16. The method as claimed in claim 15 further comprising the step of annealing said optical waveguide to stabilize the change in the refractive index of said grating.

17. The method as claimed in claim 15 wherein said optical waveguide includes a protective polymeric coating, and wherein the method further comprises the step of removing the coating prior to the step of irradiating.

18. The method as claimed in claim 15 wherein said irradiating step comprises passing UV radiation through an amplitude mask to form a long period grating within said optical waveguide.

19. The method as claimed in claim 15 wherein said irradiating step comprises passing UV radiation through a phase mask to form a fiber Bragg grating in said optical waveguide.

20. The method as claimed in claim 15 wherein said optical waveguide comprises an optical waveguide fiber.

21. The method as claimed in claim 15 wherein said optical waveguide comprises a planar optical waveguide.

22. The method as claimed in claim 15 wherein the temperature comprises a temperature greater than a maximum operating temperature of said optical waveguide.

23. The method as claimed in claim 15 wherein said exposing step comprises flooding said at least a portion of said optical waveguide with a uniform beam of UV radiation.

24. The method as claimed in claim 15 wherein said exposing step comprises the step of flooding at least said irradiated portion with UV radiation.

25. The method as claimed in claim 15 wherein said exposing step comprises the step of flooding at least said irradiated portion with infra-red radiation.

26. In a method of enhancing the photosensitivity of an optical waveguide wherein the optical waveguide is hydrogen loaded to form an associated baseline refractive index, at least a portion of the loaded optical waveguide is treated to induce a change in the baseline refractive index, and the hydrogen is completely diffused from the loaded optical waveguide to stabilize the induced change in refractive index, said improvement comprising:

treating at least the treated portion to induce a change in the stabilized induced change in refractive index that is greater than $10^{-5}$.

* * * * *